(12) United States Patent
Hardee

(10) Patent No.: US 6,990,029 B2
(45) Date of Patent: Jan. 24, 2006

(54) COLUMN READ AMPLIFIER POWER-GATING TECHNIQUE FOR INTEGRATED CIRCUIT MEMORY DEVICES AND THOSE DEVICES INCORPORATING EMBEDDED DYNAMIC RANDOM ACCESS MEMORY (DRAM)

(75) Inventor: Kim C. Hardee, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 7 days.

(21) Appl. No.: 10/776,054

(22) Filed: Feb. 11, 2004

(65) Prior Publication Data

US 2005/0052917 A1    Mar. 10, 2005

Related U.S. Application Data

(60) Provisional application No. 60/500,126, filed on Sep. 4, 2003.

(51) Int. Cl.
*G11C 7/00* (2006.01)

(52) U.S. Cl. .................. 365/205; 365/207; 365/208
(58) Field of Classification Search ............. 365/205, 365/207, 208
See application file for complete search history.

(56) References Cited

U.S. PATENT DOCUMENTS 6,208,575 B1 * 3/2001 Proebsting ............... 365/208
6,275,432 B1 * 8/2001 Hardee ..................... 365/207
6,449,182 B1 * 9/2002 Ooishi ...................... 365/208

OTHER PUBLICATIONS

Min, Kyeong-Sik, Kawaguchi, Hiroshi, Sakurai, Takayasu, ZigZag Super Cut-off CMOS (ZSCCMOS) Block Activation with Self-Adaptive Voltage Level Controller: An Alternative to Clock-Gating Scheme in Leakage Dominant Era, 2003 IEEE International Solid-State Circuits Conference, Feb. 12, 2003,Salon 1-6, pp. 400-401 and 501-502.

* cited by examiner

*Primary Examiner*—Trong Phan
(74) *Attorney, Agent, or Firm*—William J. Kubida; Peter J. Meza; Hogan & Hartson LLP

(57) ABSTRACT

A column read amplifier power-gating technique for DRAM devices and those devices incorporating embedded DRAM which incorporate a power-down (or Sleep) mode of operation which overcomes the deficiencies of conventional power-gating approaches by eliminating the need for a large, separate power-gating transistor thereby saving on-chip area yet still reducing power during Sleep Mode. In operation, the column select signal YR is controlled such that it is driven below VSS during Sleep Mode when N-channel pass transistors are used in the column read amplifier or to a supply voltage level of VCC when P-channel devices are used instead. This significantly reduces the current through the pass transistors and yet causes no reduction in the switching speed of the column read amplifiers.

25 Claims, 2 Drawing Sheets

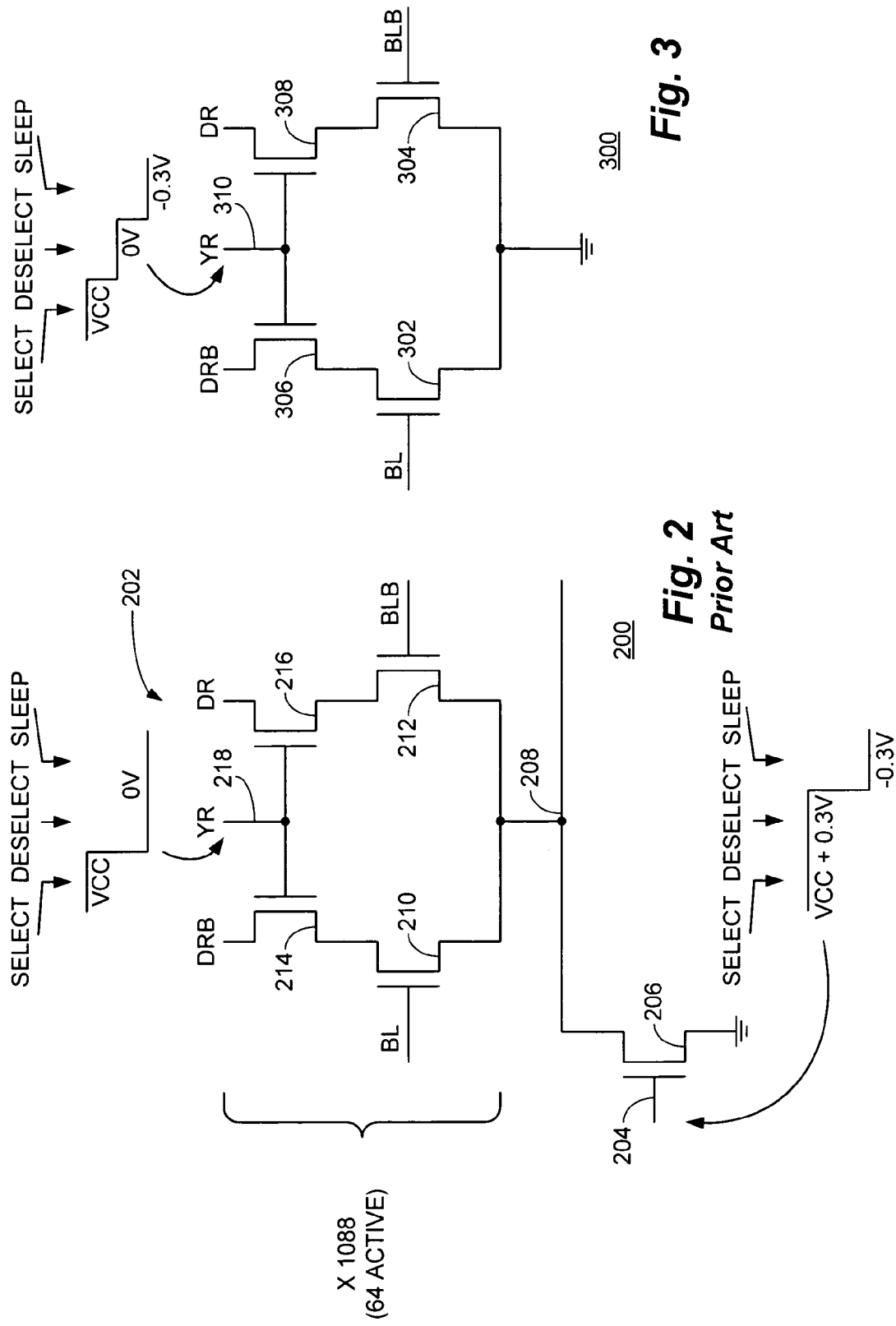

COLUMN READ AMPLIFIER POWER-GATING TECHNIQUE FOR INTEGRATED CIRCUIT MEMORY DEVICES AND THOSE DEVICES INCORPORATING EMBEDDED DYNAMIC RANDOM ACCESS MEMORY (DRAM)

CROSS REFERENCE TO RELATED PATENT APPLICATIONS

The present invention is related to, and claims priority from, U.S. Provisional Patent Application Ser. No. 60/500,126 filed Sep. 4, 2003 for: "0.6V 205 MHz 19.5 nsec TRC 16 Mb Embedded DRAM" the disclosure of which is herein specifically incorporated in its entirety by this reference. The present invention is further related to the subject matter disclosed in U.S. patent applications Ser. No. 10/776,103 entitled: "Sense Amplifier Power-Gating Technique for Integrated Circuit Memory Devices and Those Devices Incorporating Embedded Dynamic Random Access Memory (DRAM)" and 10/776,101 entitled: "High Speed Power-Gating Technique for Integrated Circuit Devices Incorporating a Sleep Mode of Operation", the disclosures of which are herein specifically incorporated by this reference in its entirety.

BACKGROUND OF THE INVENTION

The present invention relates, in general, to the field of integrated circuit memory devices and those devices incorporating embedded dynamic random access memory (DRAM). More particularly, the present invention relates to a column read amplifier power-gating technique for DRAM devices and those devices incorporating embedded DRAM which incorporate a power-down (or Sleep) Mode of operation.

Many types of DRAM based devices, or integrated circuits including embedded memory arrays, are currently available including extended data out ("EDO"), synchronous DRAM ("SDRAM"), double data rate ("DDR") DRAM and the like. Regardless of configuration, the primary purpose of the DRAM is to store data. Functionally, data may be written to the memory, read from it or periodically refreshed to maintain the integrity of the stored data. In current high density designs, each DRAM memory cell comprises a pass transistor coupled to an associated capacitor that may be charged to store a value representative of either a logic level "1" or "0". Data stored in these memory cells may be read out and written to them through columns of sense amplifiers coupled to complementary bit lines interconnecting rows of these cells.

Column read amplifiers have been used in integrated memory circuits to improve the speed of reading data. For DRAMs, column read amplifiers are located adjacent to the bit line sense amplifiers and the bit lines (or sense latch nodes) are connected to the gates of a pair of transistors to control the drain-to-source current through these transistors. The sources of these transistors are generally connected to a reference voltage level of circuit ground (VSS) while their drains are connected to the sources of a pair of pass transistors. These pass transistors have their gates connected to receive a column select signal (YR) and their drains are connected to the complementary local read data lines (DR and DR bar or "DRB").

In operation, the data lines are precharged "high" to a supply voltage level (VCC). When the column select signal YR goes "high", one of the data lines is driven "low" depending on which bit line is "high". Normally, the signal YR is at 0V (VSS) when the column in not selected and is at VCC when the column is selected.

Power-gating can be used to reduce Sleep Mode power. A conventional approach involves the addition of a large power-gating transistor between the column read amplifiers and VSS. Generally, there may be a large number (on the order of 1024 or more) of read amplifiers sharing a single power-gating transistor and more than one read amplifier would be activated at the same time (typically from 16 to 128 or more). The gate of the power-gating transistor is conventionally driven below VSS during Sleep Mode to reduce the current through the read amplifiers.

The difficulty with this approach is that in the Select Mode, the current surge through the power-gating transistor can be unacceptably large due to the fact that multiple read amplifiers switch simultaneously. This causes a voltage drop across the power-gating transistor which reduces the switching speed of the read amplifiers. Furthermore, as previously mentioned, the power-gating transistor must be made very large in an attempt to minimize this voltage drop, thereby also consuming a large amount of on-chip area.

SUMMARY OF THE INVENTION

Disclosed herein is a column read amplifier power-gating technique for DRAM devices and those devices incorporating embedded DRAM which incorporate a power-down (or Sleep) mode of operation which overcomes the deficiencies of conventional power-gating approaches. It advantageously eliminates the need for a large, separate power-gating transistor thereby saving on-chip area yet still reduces power during Sleep Mode. In operation, instead of adding the additional power-gating device, the column select signal YR is controlled such that it is now driven below VSS during Sleep Mode when N-channel pass transistors are used. If P-channel devices are used, the YR signal is driven above a supply voltage level of VCC. In either case, this significantly reduces the current through the pass transistors and yet causes no reduction in the switching speed of the column read amplifiers.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 2 is a schematic illustration of a conventional column read amplifier power-gating circuit and technique for placing the amplifier in one of a Select, Deselect or Sleep Mode of operation; and FIG. 3 is a corresponding illustration of a representative embodiment of an improved column read amplifier and power-gating circuit in accordance with the technique of the present invention through which the column read amplifier may be placed into each of the three aforementioned states without the need for a large, separate power-gating transistor.

DESCRIPTION OF A REPRESENTATIVE EMBODIMENT

Figure 1:
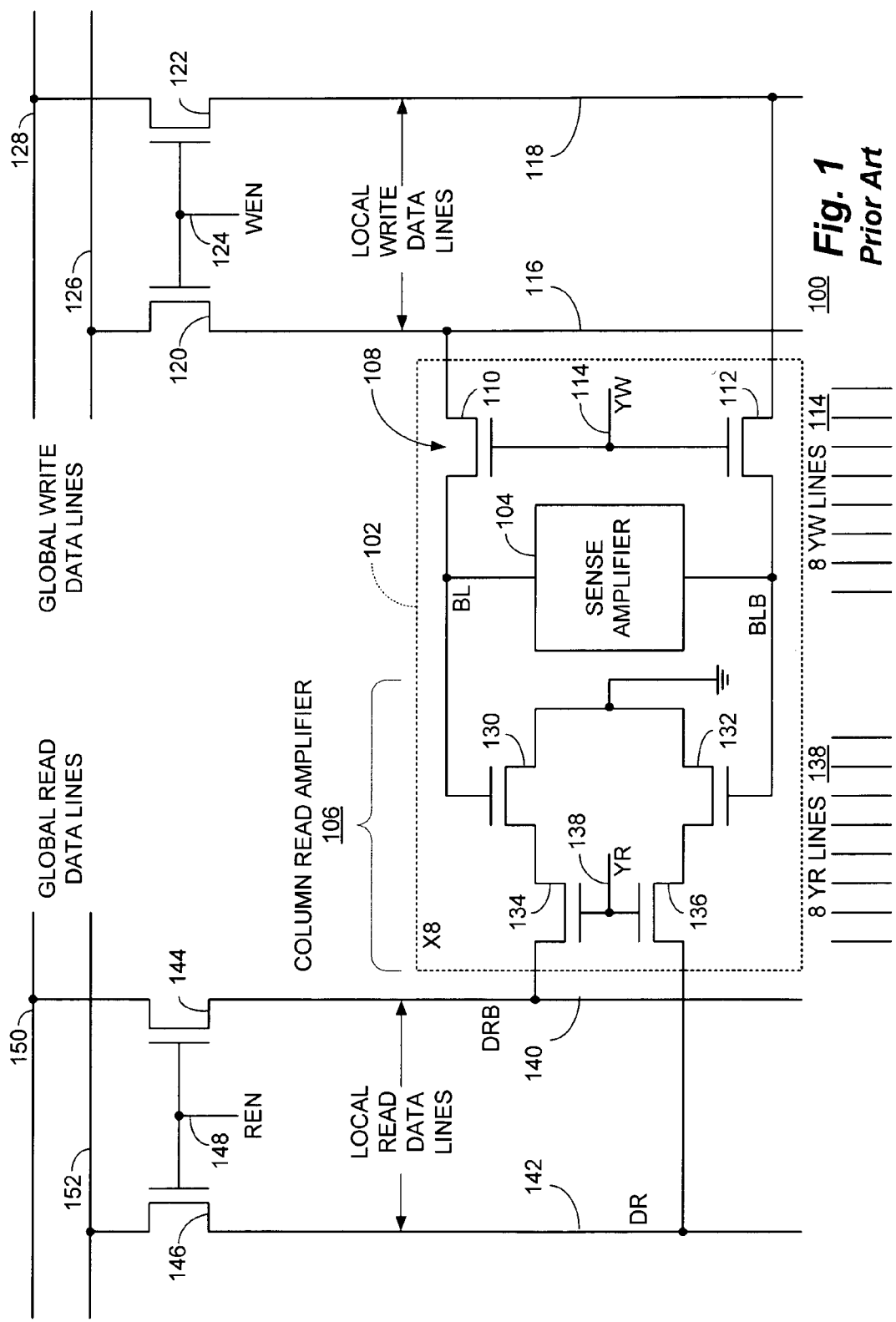
FIG. 1 is a high level schematic and functional block diagram of the global and local read and write data lines of a conventional integrated circuit memory array together with a representative sense amplifier and associated non-power-gated column read and write circuitry.

With reference now to FIG. 1, a high level schematic and functional block diagram of the global and local read and write data lines of a conventional, integrated circuit memory array 100 are shown together with a representative sense amplifier and associated non-power-gated column read and write circuitry.

The memory array 100 comprises, in pertinent part, a read/write circuit 102 which may, in a particular implementation, comprise one of eight such circuits as indicated. The read/write circuit 102 comprises a sense amplifier 104 coupled between a pair of complementary bit lines (BL and BLB). Associated with each sense amplifier 104 is a column read amplifier 106 and a column write circuit 108, the former of which will be more fully describe hereinafter.

Global write data lines 126 and 128 are selectively coupled through N-channel transistors 120 and 122 respectively to local write data lines 116 and 118 in response to a write enable (WEN) signal applied to the gate terminals of transistors 120, 122. In turn, the local write data lines 116 and 118 are selectively coupled through N-channel transistors 110 and 112 respectively to complementary bit lines BL and BLB in response to a column write (YW) signal applied to the gate terminals of transistors 110 and 112 at line 114.

The complementary bit lines BL and BLB are also connected to the gate terminals of N-channel transistors 130 and 132 respectively to control their drain-to-source current. The sources of transistors 130 and 132, in this non-power-gated representation, are connected directly to VSS or circuit ground. The drain terminal of each of these two devices are respectively connected to the source terminals of N-channel transistors 134 and 136 which function as pass transistors with the column read signal (YR) being applied to their common connected gate terminals. The drain terminal of transistor 134 is connected to one of a pair of local read data lines 140 (DRB) and the drain terminal of transistor 136 is connected to local read data line 142 (DR). The local read data lines 140 and 142 are respectively couplable through N-channel transistors 144 and 148 to each of a pair of global read data lines 150 and 152 in response to a read enable (REN) signal applied to the common connected gates of transistors 144 and 146 on line 148.

In operation, the local read data lines 140, 142 are precharged "high" to a supply voltage level (VCC). When the column select signal YR goes "high" at line 138, one of the data lines 140, 142 is driven "low" depending on which bit line (BL or BLB) is "high". Normally, the signal YR is at 0V (VSS) when the column in not selected and is at VCC when the column is selected.

With reference additionally now to FIG. 2, a schematic illustration of a conventional column read amplifier power-gating circuit 200 is shown together with the conventional technique for placing the amplifier in one of a Select, Deselect or Sleep Mode of operation.

The column read amplifier power-gating circuit 200 comprises a number (e.g. 1088 in the embodiment shown, 64 of which are active) of conventional column read amplifiers 202 in conjunction with a large, separate power-gating N-channel transistor 206 which is controlled by a power-gating signal applied to its gate terminal on line 204. As will be more fully described hereinafter, the power-gating transistor 206 serves to couple or decouple the column read amplifier 202 to VSS in accordance with the signal placed on line 204 in consonance with other signals applied to the YR input.

The drain terminal of transistor 206 defines a power-gated node 208 to which the source terminals of N-channel transistors 210 and 212 are connected. The bit lines BL and BLB are coupled to the gate terminals of transistors 210 and 212 respectively. The drain terminals of transistors 210 and 212 are respectively connected to the source terminals of N-channel pass transistors 214 and 216 which have their common connected gates coupled to receive the column read signal YR at line 218. The drain terminals of transistors 214 and 216 are respectively connected to the local read data lines DRB and DR.

In a Select Mode of operation, the conventional column read amplifier power-gating circuit 200 has a level of VCC applied to YR input 218 turning "on" transistors 214 and 216 and a concurrent VCC+0.3V applied to the gate of power-gating transistor 206 on line 204 overdriving it "on". As previously indicated, since multiple column read amplifiers 200 switch simultaneously, the current surge through the power-gating transistor 206 is quite large, causing an effective voltage drop across this device which serves to reduce the switching speed of the column read amplifiers 200.

In a Deselect Mode of operation, the signal on line 204 remains at a level of VCC+0.3V while the signal on YR input 218 switches to a level of 0V (VSS), turning transistors 214 and 216 "off". In a Sleep Mode of operation, the YR input remains at 0V while the signal on input 204 switches to a level of −0.3V overdriving transistor 206 "off" to reduce the current through the column read amplifiers 202.

With reference additionally now to FIG. 3, a corresponding illustration of a representative embodiment of an improved column read amplifier and power-gating circuit 300 is shown (it may be one of many) together with the technique of the present invention through which the column read amplifiers may be placed into Select, Deselect and Sleep Modes of operation without the need for a large, separate power-gating transistor.

The column read amplifier and power-gating circuits 300 of the present invention comprise a pair of N-channel transistors 302 and 304 with their sources coupled to VSS without the need for a large, separate power-gating transistor 206 (FIG. 1) or the need to separately route a power-gating signal to its gate terminal. The drain terminals of transistors 302 and 304 are respectively coupled to the source terminals of N-channel pass transistors 306 and 308 which have their gate terminals connected together to receive a column read (YR) signal in accordance with the technique of the present invention. The drain terminals of transistors 306 and 308 are respectively connected to the local read data lines DRB and DR as indicated.

In a Select Mode of operation, a single YR signal level of VCC is applied to line 310 turning both transistors 306 and 308 "on", while in a Deselect Mode of operation, a level of 0V (VSS) is applied on line 310 turning both devices "off". In a Sleep Mode of operation, a level of −0.3V (below the level of VSS) is applied to line 310 overdriving transistors 306 and 308 "off" to significantly reduce current through these pass transistors 306, 308 and, therefore, through the column read amplifier and power-gating circuit 300. The technique of the present invention causes no reduction in the switching speed of the column read amplifier and power-gating circuit 300.

While the foregoing description and accompanying figures have contemplated the use of N-channel devices in the implementation of the technique of the present invention, it should be noted that if P-channel devices are utilized instead, then the YR signal on line 310 would be merely inverted with the column read amplifier and power-gating circuit 300 being coupled to VCC (instead of VSS) and the data lines precharged to VSS ("low") instead of to VCC.

While there have been described above the principles of the present invention in conjunction with specific circuitry and voltage levels, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for power-gating a column read amplifier comprising N-channel pass transistors in a memory array, said method comprising:
    applying a column read signal to said read amplifier of substantially a supply voltage level in a Select Mode of operation;
    applying a column read signal to said read amplifier of substantially a reference voltage level in a Deselect Mode of operation; and
    applying a column read signal to said read amplifier of less than said reference voltage level in a Sleep Mode of operation.

2. A method for power-gating a column read amplifier comprising P-channel pass transistors in a memory array, said method comprising:
    applying a column read signal to said read amplifier of substantially a reference voltage level in a Select Mode of operation;
    applying a column read signal to said read amplifier of substantially a supply voltage level in a Deselect Mode of operation; and
    applying a column read signal to said read amplifier of more than said supply voltage level in a Sleep Mode of operation.

3. A power-gated column read amplifier having Select, Deselect and Sleep states thereof comprising:
    first and second transistors having a first terminal thereof coupled to a reference voltage level and a control terminal thereof coupled to one of a pair of complementary bit lines;
    third and fourth transistors in series with said first and second transistors respectively for selectively coupling one of a pair of complementary read data lines to second terminals of said first and second transistors in response to a column read signal coupled to a control terminal of said third and fourth transistors
    whereby in a Sleep Mode of operation, said column read signal is at a level below that of said reference voltage level.

4. The power-gated column read amplifier of claim 3 wherein, in a Select Mode of operation, said column read signal is substantially at a supply voltage level.

5. The power-gated column read amplifier of claim 3 wherein, in a Deselect Mode of operation, said column read signal is substantially at said reference voltage level.

6. The power-gated column read amplifier of claim 3 wherein said first, second, third and fourth transistors comprise MOS transistors.

7. The power-gated column read amplifier of claim 6 wherein said third and fourth transistors comprise N-channel transistors.

8. A power-gated column read amplifier having Select, Deselect and Sleep states thereof comprising:
    first and second transistors having a first terminal thereof coupled to a supply voltage level and a control terminal thereof coupled to one of a pair of complementary bit lines;
    third and fourth transistors in series with said first and second transistors respectively for selectively coupling one of a pair of complementary read data lines to second terminals of said first and second transistors in response to a column read signal coupled to a control terminal of said third and fourth transistors
    whereby in a Sleep Mode of operation, said column read signal is at a level above that of said supply voltage level.

9. The power-gated column read amplifier of claim 8 wherein, in a Select Mode of operation, said column read signal is substantially at a reference voltage level.

10. The power-gated column read amplifier of claim 8 wherein, in a Deselect Mode of operation, said column read signal is substantially at said supply voltage level.

11. The power-gated column read amplifier of claim 8 wherein said first, second, third and fourth transistors comprise MOS transistors.

12. The power-gated column read amplifier of claim 8 wherein said third and fourth transistors comprise P-channel transistors.

13. An integrated circuit device including a memory array comprising a power-gated column read amplifier having Select, Deselect and Sleep operational modes thereof, said device comprising:
    a column read signal input to said power-gated column read amplifier for receiving a column read signal comprising three distinct voltage level states, each of said voltage level states corresponding to one of said Select, Deselect and Sleep operational modes.

14. The integrated circuit device of claim 13 wherein said power-gated column read amplifier comprises:
    first and second transistors having a first terminal thereof coupled to a reference voltage level and a control terminal thereof coupled to one of a pair of complementary bit lines; and
    third and fourth transistors in series with said first and second transistors respectively for selectively coupling one of a pair of complementary read data lines to second terminals of said first and second transistors in response to said column read signal coupled to a control terminal of said third and fourth transistors.

15. The integrated circuit device of claim 14 wherein, in said Sleep operational mode, said column read signal is at a level below that of said reference voltage level.

16. The integrated circuit device of claim 14 wherein, in said Select operational mode, said column read signal is substantially at a supply voltage level.

17. The integrated circuit device of claim 14 wherein, in said Deselect operational mode, said column read signal is substantially at said reference voltage level.

18. The integrated circuit device of claim 14 wherein said first, second, third and fourth transistors comprise MOS transistors.

19. The integrated circuit device of claim 18 wherein said third and fourth transistors comprise N-channel transistors.

20. The integrated circuit device of claim 13 wherein said power-gated column read amplifier comprises:
    first and second transistors having a first terminal thereof coupled to a supply voltage level and a control terminal thereof coupled to one of a pair of complementary bit lines; and
    third and fourth transistors in series with said first and second transistors respectively for selectively coupling one of a pair of complementary read data lines to second terminals of said first and second transistors in response to said column read signal coupled to a control terminal of said third and fourth transistors.

21. The integrated circuit device of claim 20 wherein, in said Sleep operational mode, said column read signal is at a level above that of said supply voltage level.

22. The integrated circuit device of claim 20 wherein, in said Select operational mode, said column read signal is at a level substantially that of a reference voltage level.

23. The integrated circuit device of claim 20 wherein, in said Deselect operational mode, said column read signal is substantially at said supply voltage level.

24. The integrated circuit device of claim 20 wherein said first, second, third and fourth transistors comprise MOS transistors.

25. The integrated circuit device of claim 20 wherein said third and fourth transistors comprise P-channel transistors.

* * * * *